United States Patent
Cheah et al.

(10) Patent No.: US 7,362,149 B1
(45) Date of Patent: Apr. 22, 2008

(54) ZERO CROSSING DETECTION AND CORRECTION UPON A DISTORTED PRIMARY AC POWER LINE VOLTAGE

(75) Inventors: Chin Hong Cheah, Penang (MY); Lian Ping Teoh, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 60 days.

(21) Appl. No.: 11/551,953

(22) Filed: Oct. 23, 2006

(51) Int. Cl.
*H03K 4/06* (2006.01)

(52) U.S. Cl. ............... 327/131; 327/132; 327/133; 327/134; 327/135; 327/136; 327/137; 327/138; 327/139; 327/140

(58) Field of Classification Search ......... 327/131–140
See application file for complete search history.

(56) References Cited

U.S. PATENT DOCUMENTS 3,699,458 A * 10/1972 Martin et al. ............... 327/133
2005/0035795 A1* 2/2005 Liu ............................. 327/131

* cited by examiner

*Primary Examiner*—Charles D. Garber
*Assistant Examiner*—John W Poos

(74) *Attorney, Agent, or Firm*—Marc Bobys

(57) ABSTRACT

Zero crossings for a non-symmetrical $V_{IN}$ may be determined by first amplifying and clipping $V_{IN}$ to create a non-symmetrical square wave whose zero crossings are those of $V_{IN}$. A selected polarity edge of the non-symmetrical square wave may be taken as a 0° indicator and is used to create a fundamental sawtooth ramp of the same frequency and in phase with $V_{IN}$. The fundamental sawtooth ramp starts at zero volts, linearly ramps to some peak and is AC coupled to a comparator whose other input is zero volts. That creates a square wave that is symmetrical as to its half-cycles, and whose every other edge is synchronous with the start of the fundamental sawtooth ramp, and whose intervening edges occur in the middle of the ramp. The intervening edge is detected and taken as a 180° indicator. The 0° indicator and the 180° indicator can be merged into a combined signal that may be used to initiate synchronous rectification as well as to create a utility sawtooth ramp at twice the rate of the fundamental sawtooth ramp and whose amplitude may also be controlled. The fundamental ramp can be used to create an arbitrary number of selectedly placed pulses indicative of a desired division of the period of a cycle for $V_{IN}$ by first creating a steady voltage proportional to the peak voltage of the fundamental ramp, and then comparing proportional occurrences of that fundamental ramp to thresholds that are selected percentages of the steady voltage proportional to the peak voltage.

8 Claims, 4 Drawing Sheets

FIG. 1
(PRIOR ART)

ZERO CROSSING DETECTION AND CORRECTION UPON A DISTORTED PRIMARY AC POWER LINE VOLTAGE

There are many power supply related applications where it is particularly advantageous if "something is done" when, or in some selected relation to "when," the applied primary AC line voltage (e.g., 110 VAC, 220 VAC) is instantaneously at zero volts, which is to say, experiencing a zero crossing. These applications include the internal goings on within a "switching power supply" where there is an urge to limit in-rush current to filter capacitors and otherwise ease the burden on semiconductor switches (e.g., FETs, SCRS, etc.) by making or breaking a connection at the zero crossing of the applied AC power, or by doing so in phased synchrony with such zero crossings. A similar set of concerns can be identified for a UPS (Uninterruptible Power Supply); one respectable way to replace failing primary AC power is wait for a zero crossing to detach from the mains and substitute a replacement sine wave at the power line's frequency and amplitude. If that is done correctly the load is never the wiser. It will be appreciated that it is not just 50/60 Hz110/220 VAC single phase applications of the consumer and light industrial grade equipment that practice these techniques; they are also found in commercial grade equipment and three phase heavy industrial applications, as well.

"Doing something" upon or in relation to the occurrence of a zero crossing requires detection of a regular occurring feature in the signal of interest. Most often that is the actual zero crossings themselves, as that is where (for sine waves, anyway) the greatest dv/dt is experienced, making detection least sensitive to error based on amplitude resolution. (Detection of the peak voltage, on the other hand, is a location where dv/dt is zero, and is generally regarded as a poor choice for this purpose.) Accordingly, it is conventional to find various manner of zero crossing detection in use upon power line voltages to further these ends. Unfortunately, their performance is not always as good as desired.

To appreciate the general reasons for concern, refer now to FIG. 1, which is a generalized block diagram 1 of one type of prior art solution to zero crossing detection for use in various switching power supply applications.

A (possibly non-ideal) source of primary AC power (let's say 110 VAC, 1φ) 2 includes an "AC source" 3 that might be a battery powered oscillator/power amplifier combination of some sort, a low cost inverter purchased from one of the world's largest discount retailers, a generator powered by an internal combustion engine, or, perhaps even the power company's AC mains as degraded by some unfortunate circumstances (really bad power factor compounded by some very impolite large loads that do not draw current uniformly during a cycle.) We show a simple case that can represent the others. Suppose there is an intrinsic inductance 4A within a (non-ideal) source of primary power 2 (perhaps it is an inverter with a transformer output). On the other hand, the source of primary power 2 might be the actual mains, and be a fairly suitable source with no objectionable intrinsic inductance 4A.

To continue, at a power outlet 5 the plug 6 for some electronic apparatus 7 is connected to primary AC power source 2. It has an ON-OFF switch 8 that, when in the ON position connects the "black" ("hot side") 10 to one side of the "input" of a single phase switching power supply 13, while the "white" (or "neutral") 9 is similarly connected. The purpose of the power supply is to supply a regulated voltage to some load 23. Exactly what the inputs 9 and 10 are connected to varies according to the nature of the application. We shall sketch a couple of possibilities, and point out what it is that can give rise to some things that concern us.

First, there are some applications were the genuine black and white sides of the mains are actually connected to a synchronous rectifier. That is, switched black ("hot") lead 10 is actually input lead 15, while switched white ("neutral") lead 9 is actually input lead 14. This is not common in consumer grade equipment, but it does occasionally happen elsewhere. Another case (which the already too busy FIG. 1 does not show) would be where a full wave bridge rectifier might exist directly across the mains, and some synchronous switching mechanism (20) is connected between the rectifiers and a capacitive input filter. In either case, the intrinsic inductance 4A could function as a villain, as described below.

In other applications the black 10 and white 9 sides of the mains energize the primary of a power transformer 11, and its secondary is either directly connected to the switching mechanism 20 (which is a case we don't show), or (as is shown) the secondary is applied to a full-wave bridge rectifier 12 whose output is connected to switch 20. The switching mechanism 20 might be part of just a "pre-regulator" followed by a linear series pass style regulator 22 built around a bi-polar or field effect transistor, or, it might be the sole mechanism for voltage regulation. In any of these cases the power transformer 11 can exhibit intrinsic inductance 4B, and it will be appreciated that if both 4A and 4B are present they will combine to produce an even larger intrinsic inductance.

Consider the case of a laboratory grade bench power supply. In that case the switching mechanism is apt to be a pre-regulator that is followed by a linear stage, and the supply may be expected to operate over a wide range of conditions. (And, we note that the load 23 will then be external to apparatus 7.) For various reasons a "battleship grade" power supply might have a power transformer that can be "extra powerful," the better to not be the weakest link in the chain, as it were. That might mean that it has more intrinsic inductance than similar power transformers used in other applications.

In the case of a switching power supply, we can suppose that were are intent on converting a raw rectified or un-rectified AC input voltage $V_{PWR}$ to some one or more regulated DC voltages to be used within the electronic apparatus 7. The voltage $V_{PWR}$ will be the potential difference between conductors 14 and 15. As the preceding discussion indicated, $V_{PWR}$ might be white 9 and black 10 directly, or the un-rectified output from a secondary of the power transformer 11, or the rectified output of a bridge rectifier (12).

In this illustrative multi-case prior art example, a conventional zero crossing detector 16 has an input $V_{IN}$ (17, 18) and produces a sequence of zero crossing pulses 19 (or, in some cases, a series of sawtooth ramps) that are used by a switching mechanism 20, which might function either as a synchronous rectifier or a phase duration controlled (variable duty cycle) switch. Under the control of circuitry we have not shown, but that is conventional and understood by those familiar with this sort of thing, the switching mechanism 20 stays closed for the length of time needed to impart an adequate amount of charge to a filter that is essentially a filter capacitor 21. This is the main mechanism for conversion of the applied high voltage/can-supply-high-current primary AC input to a generally regulated low voltage DC supply. An optional additional voltage regulator 22 may further adjust the voltage delivered to the load 23.

Just what leads 17 and 18 ($V_{IN}$) are connect to is somewhat dependent on what happens to leads 9/10 as they become leads 14/15. The idea is to expose the zero crossing detector to the original sine wave, or a reduced voltage replica thereof (say, from a tertiary winding in the power transformer 11) that conveys when $V_{PWR}$ is at a minimum. So, $V_{IN}$ might be $V_{PWR}$, or something else that has the same phase.

Now as for what it is that goes wrong. It is not so much that existing zero crossing detectors can't function to locate the actual zero crossings they are exposed to and experience. They can. Unfortunately, some of the zero crossings might not be where they ought to be, and it would be better for the internal operation of the switching mechanism if we could say that they occurred when they should have. Which is to say, we should like to indicate where the real zero crossings in the AC mains really did occur back at (real) AC source 3 and before any mischief caused by the intrinsic inductance 4A/B. Conventional zero crossing detectors exposed to voltages appearing downstream from the intrinsic inductance are not equipped to offer an opinion about where in time a zero crossing should have occurred—they indicate when in time that they actually do occur. Phase locked loops have been used to compensate for this, but they have loop response time and capture ranges that can make them seem clumsy and not sufficiently agile to cope with the behavior of a non-ideal source of primary power.

"Why" you might ask, "does $V_{IN}$ have detected zero crossings that are not where they ought to be? How can such an outrage happen?" Well, it is fairly easy if the load is capacitive and the source is inductive, and can amount to anywhere from say, three to thirty degrees of phase shift.

To see the mischief that is afoot, refer now to FIG. 2. It is an exemplary waveform diagram 24 depicting a $V_{IN}$ with which a zero crossing detector might have to cope. We see a distorted sine wave 25 as $V_{IN}$ whose (in this case negative going) zero crossing 26 is not at the 180° location 27, but that is instead late by an amount of phase 28. We shall say that $V_{IN}$ exhibits a phase shifted zero crossing. (One might wonder if both the positive and negative going zero crossings been shifted. Maybe. But we don't have access to what really goes on inside the primary AC source 2 and before the intrinsic inductance. We just pick one of the pair of zero crossings for some cycle that we can observe after the intrinsic inductance. Also, if they have both been shifted by the exact same amount, then we cannot tell that such is the case, and we don't consider such a case—and there is no need to, as that case would not be bothersome. In the more common case, however, the effect of the switching is more pronounced (or perhaps happens only) during one half-cycle of $V_{IN}$. To compound matters further, the intrinsic inductance might not be constant, but vary as a function of the current being drawn. These circumstances, in conjunction with the impedance of the source and the reactive nature of the load, gives rise to the lop-sided waveform shown in FIG. 2.

Note that the time between zero crossings 26/30 and 29/31 are not the same as for 30/29 and 31/32. A pulse train (or other waveform) representing the occurrence of zero crossings 26,30,29,31,32 . . . would not have equally spaced pulses. We can be sure of two things. First, it is most unlikely that the actual zero crossings in the power company's AC mains have such an imbalance in their locations. Second, if the foregoing is true, then at least half of the zero crossings in FIG. 2 (which are after the intrinsic inductance 4A/B) are not in the same relation with their other half as the two halves of the "real" zero crossings are to each other.

Now, and this is a fussy point worthy of extra attention, it is not so much that we care about detecting zero crossings that are truly coincident with what the zero crossings on the AC mains did back before any intrinsic inductance. It is more that, if we availed ourselves of a full wave bridge rectifier (a very common thing in bench power supplies!), we then have to provide two zero crossing "indications" per cycle of input power; one for each rectified half-cycle. These "indications" are inputs to a control loop for the switching mechanism, as are other indications of whether more or less voltage is needed. The control loop will not appreciate it if every other zero crossing indication is "jumping back and forth" with respect to the intervening ones. The control loop will be built to expect zero crossing indications that are always uniformly spaced apart, no matter what the actual case shown in FIG. 2 happens to be during any given period of operation. In particular, what we should like is a sawtooth ramp waveform that has two "saw teeth" for every cycle of input AC (before full wave rectification). What is more, we want that sawtooth waveform to have a constant amplitude, even if its individual saw teeth are of shorter or longer duration (as the input frequency varies over, say, an allowable range of 45 Hz to 65 Hz). We do not expect nor require that there be true simultaneity between the start/end of each tooth in the sawtooth and the zero crossings of the mains, or for that matter, with $V_{PWR}$. It is more that the slopes of the individual ramp teeth be correct, which is a condition established by their duration and amplitude, and that the sawtooth has some unchanging (although no particular) phase relationship to the "real" zero crossings. How these requirements cooperate with operational mechanisms within the control loop (i.e, how the control loop "works") is not of particular interest here: our concern is how to provide such a sawtooth ramp.

To sum this up, we note that a situation such as is shown in FIG. 2 does not mean the frequency of the input is changing. It only means that the intrinsic inductance and the impedance of the filter/load have disturbed the locations of the zero crossings that the zero crossing detector is exposed to. They are not equally spaced. We need the ramps in our sawtooth to be of identical duration, unless there has indeed been a change in the input frequency, in which case we want to track that and still maintain the equal duration of individual ramps. It is not so much that we care which zero crossings in FIG. 2 moved and by how much. Knowing which ones are correct won't particularly help, since the control loop does not need true simultaneity. Every other zero crossing is in the wrong spot, and we need to start a ramp where there is no detected zero crossing. We can probably guess that since series inductance is the villain, that the zero crossing (say, 30) that is ahead of the longer half cycle is more apt to be uncorrupted, and that 29 is late, but maybe not. Because the control loop does not need simultaneity, we needn't take such a risk.

Instead, we can simply pick one direction of zero crossing (say, positive going 30) and assume that the frequency is stable, or at least not varying fast enough to worry about, and proceed to find "corrected" zero crossings indications for all transitions in the other (negative going) direction (26, 29, 32, . . . ). In this case the corrected indications for the negative going zero crossings will be midway in time between the indications for the positive going zero crossings.

How to get such indications of rightful and proper (ought to be) zero crossings when Vi looks as it does in FIG. 2 is a problem. In particular, we want the indications to be consecutive equal duration ramps of constant amplitude.

This sawtooth ramp waveform needs to be synchronized to (have almost any constant phase relationship with) the "real" zero crossings, but need not exhibit simultaneity (true coincidence) with those "real" zero crossings back before the evil effects of the intrinsic inductance. Furthermore, we almost certainly will not be granted access to those "real" zero crossings. What to do?

Simplified Description

Proper zero crossings for a non-symmetrical input voltage $V_{IN}$ having consecutive half-cycles of different lengths of time are determined by first amplifying and clipping the input voltage to create a non-symmetrical square wave whose zero crossings are those of the applied waveform for $V_{IN}$. A selected polarity edge of the non-symmetrical square wave may be taken as a 0° indicator and is used to create a fundamental sawtooth ramp of the same frequency and in phase with the applied $V_{IN}$. The fundamental sawtooth ramp starts at zero volts and linearly ramps to some peak. This ramp starting at zero is AC coupled to a comparator whose other input is zero volts. Because of the linear and symmetrical nature of the AC version of the ramp, its opposing peak voltages are equidistant from zero volts, and the crossing of zero volts occurs midway in time between those two extremes. The comparator then creates a square wave that is symmetrical as to its half-cycles, and whose every other edge is synchronous with the 0° start of the fundamental sawtooth ramp, and whose intervening edges occur in the middle of the ramp. The intervening edge is detected and taken as a 180° indicator. The 0° indicator and the 180° indicator can be merged into a combined signal that may be used to initiate synchronous rectification, or some other activity, as well as to create a utility ramp at twice the rate of the fundamental sawtooth ramp and whose amplitude may also be controlled. The fundamental sawtooth ramp can be used to create an arbitrary number of selectedly placed pulses indicative of a desired division of the period of a cycle for $V_{IN}$. This may be done by first creating a steady voltage proportional to the peak voltage of the fundamental sawtooth ramp, and then comparing proportional occurrences of that fundamental sawtooth ramp to thresholds that are selected percentages of the steady voltage proportional to the peak voltage. The onsets of the respective comparisons are used to create the desired pulses.

BRIEF DESCRIPTION OF THE DRAWINGS

FIG. 1 is a simplified block diagram of an illustrative non-ideal source of primary AC power connected to energize some electronic apparatus having a conventional zero crossing detector and that is thus susceptible to degraded operation caused by phase shifted zero crossings in the $V_{IN}$ supplied to the conventional zero crossing detector;

DETAILED DESCRIPTION

Figure 2:
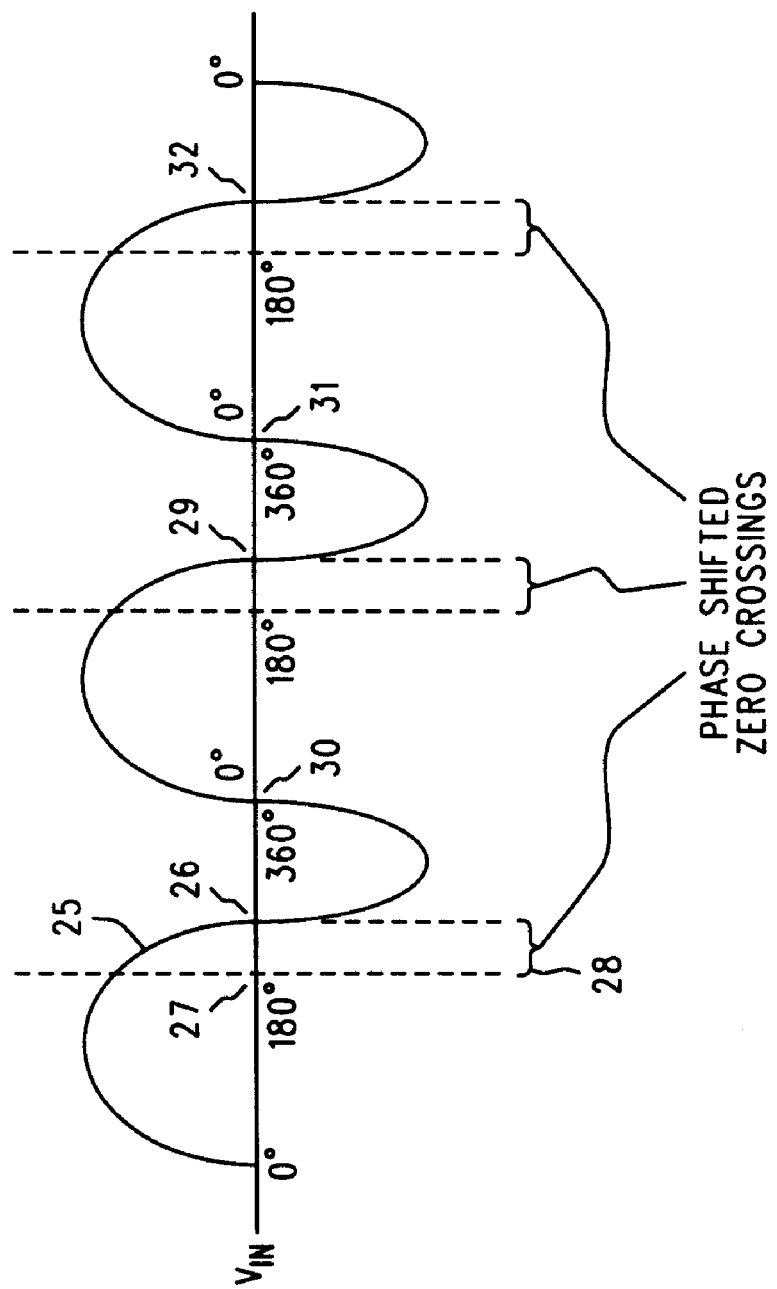
FIG. 2 is a waveform diagram illustrating the phase shifted zero crossings of FIG. 1.
Figure 3:
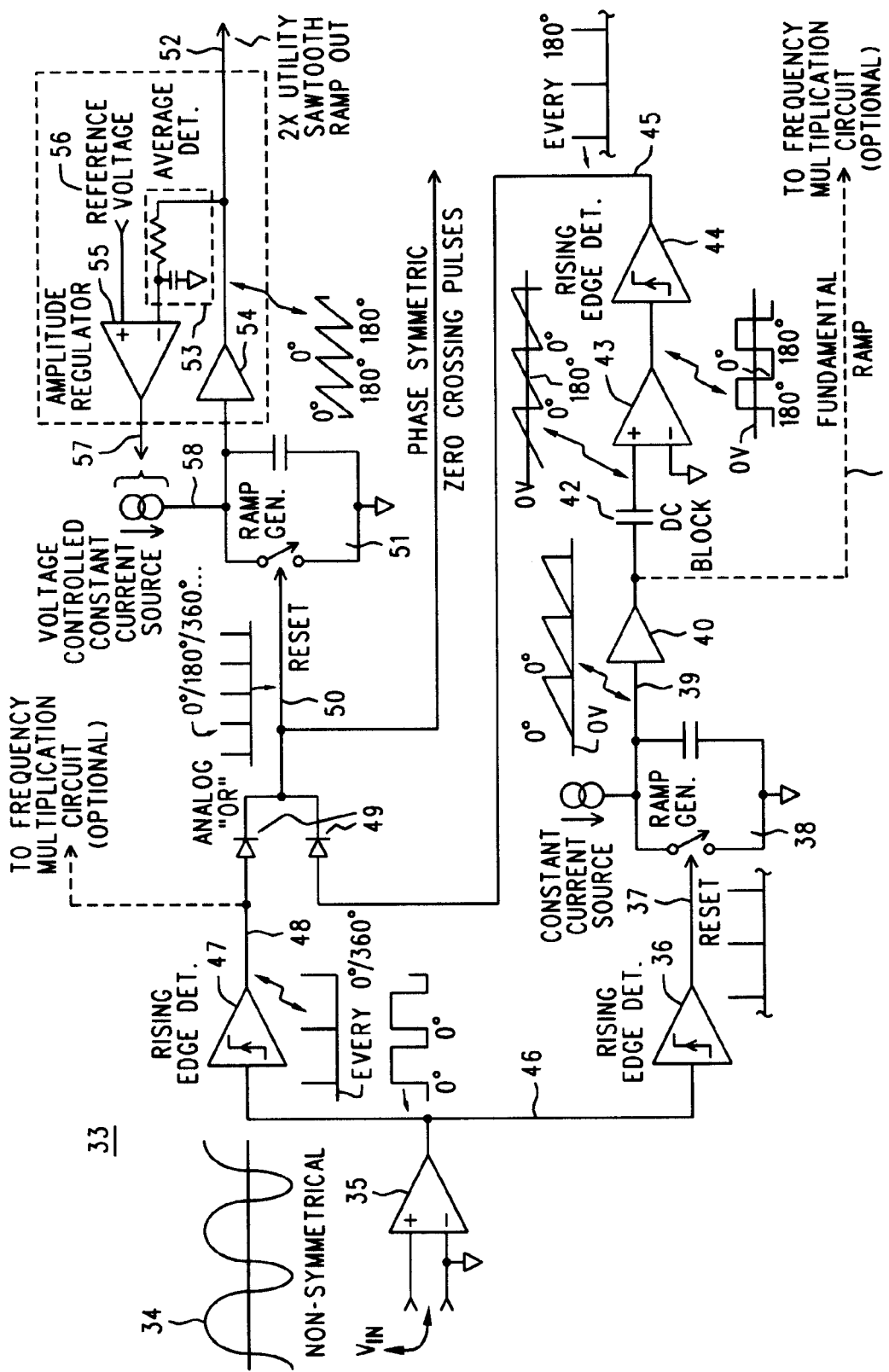
FIG. 3 is a simplified block diagram of a zero crossing detection apparatus that is tolerant of a non-symmetrical $V_{IN}$ and produces indications of where shifted zero crossings ought to be.

Refer now to FIG. 3, wherein is shown a simplified block diagram 33 of a circuit that produces from a semi-sinusoidal AC input voltage $V_{IN}$ 34 having non-symmetrical half-cycles a sawtooth ramp voltage of twice the frequency of $V_{IN}$, of constant amplitude and whose individual ramp sections are of equal duration. To begin this, $V_{IN}$ is applied to a comparator 35 whose output 46 is a square wave whose asymmetry matches that of $V_{IN}$. We arbitrarily pick the positive going rising edge of waveform 46 as the 0° location on $V_{IN}$. A rising edge detector 36 is coupled to signal 46 and produces a series of narrow pulses at an output 37 that are coincident with the rising edges of signal 46, and thus with the 0° locations of $V_{IN}$. The narrow pulses of signal output 37 reset a ramp generator, which may be formed by a constant current source that charges a fixed capacitor. The charging creates a ramp (39). A switch (e.g., a FET) resets the ramp by shorting out the capacitor for the duration of the narrow reset pulse, draining it of its charge. One end of the capacitor is grounded, so when the switch is open the ramp voltage starts from zero volts. The ramp may be buffered by an amplifier 40, and its output (41) is applied through a DC blocking capacitor 42 to the (+) input of a comparator 43 whose (−) input is grounded.

By removing the DC component of the uni-polar and referenced to ground waveform 39 the signal applied to the (+) input of the comparator 43 is balanced about ground, in that half of it will be above ground (+) and half below ground (−). Since the ramp is a linear change in voltage between two extremes that are each equidistant away from ground, the location in time when the comparator 43 changes the polarity of its output (it is being used as a squaring/clipping circuit, as was comparator 35) is at the midpoint between the start and end of the ramp sections. Since the start/end of the ramp corresponds to 0°/360°, the midpoint between them must correspond to 180°. Because of the grounded (+) input for comparator 43 the rising edge of that comparator's output, which is detected by rising edge detector 44 and indicated by its output 45, represents 180°.

Asymmetrical square wave signal 46 is also applied to a rising edge detector 47 whose output 48 is a narrow sequence of pulses representing every 0°/360°. This is "OR'ed" together with the every 180° signal 45 by an analog OR gate 49. (The diodes shown are an effective way to do this, but there are other ways, as well.) The merging of the two pulse streams (45 with 48) creates one (50) that has a narrow positive pulse for every half cycle of $V_{IN}$, whose frequency is thus twice that of $V_{IN}$, and which are (given no frequency change to $V_{IN}$) equally spaced in time. What we need to do now is trade this pulse stream for a corresponding sawtooth ramp (52) of constant amplitude.

Figure 1:
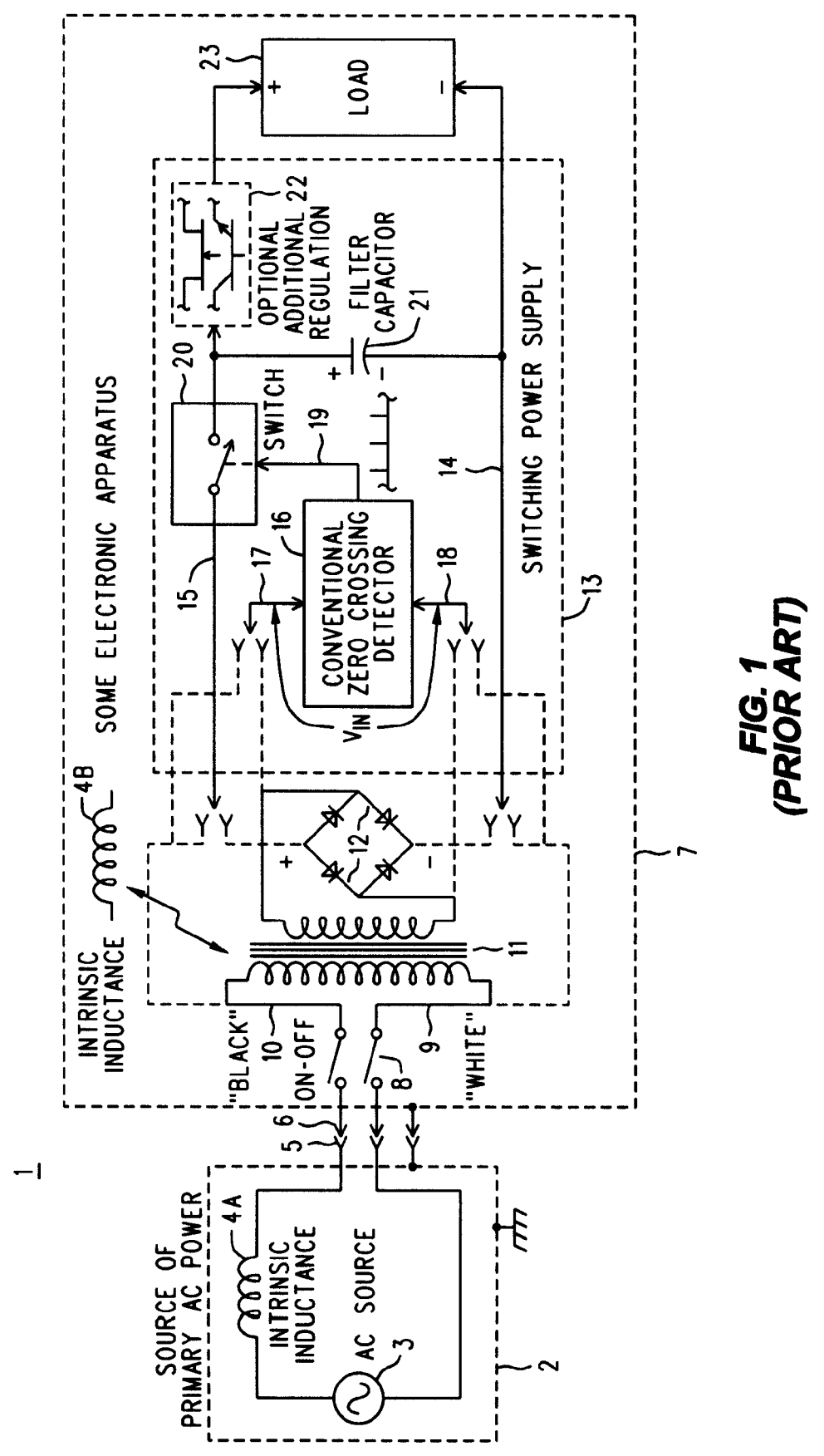

This is accomplished by applying the pulse stream 50 to another ramp generator 51 similar to 38, save that its constant current source 58 is voltage controlled. The ramp produced is buffered by amplifier 54, whose output 52 is the desired "2× UTILITY SAWTOOTH RAMP OUT" that can be used as the corrected zero crossing indications needed by the switching mechanism 20 of FIG. 1, or by a similar switching mechanism in another application. The amplitude of this signal 52 is determined by the current rate in use by the constant current source 58. That rate is in turn determined by a amplitude regulator formed by a differential amplifier 55 whose output 57 controls the rate, as the average of signal 52 is compared to a selected reference voltage 56 (i.e., it is a little feedback loop). The average value of signal 52 may be obtained from a suitable filter 53.

Figure 4:
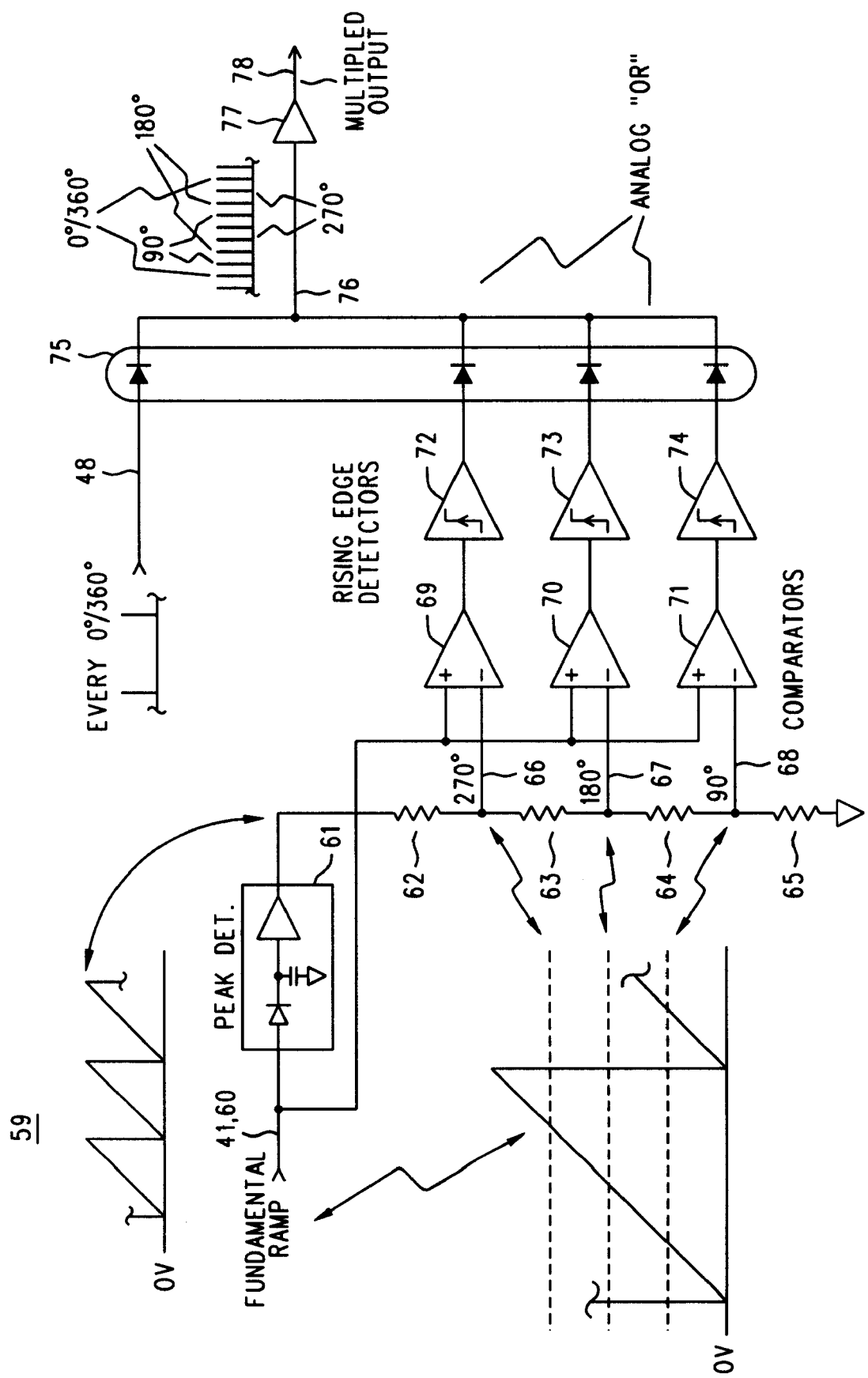
FIG. 4 is a simplified block diagram of how the circuit of FIG. 3 can be extended to provide an arbitrary number of selectedly placed pulses indicative of a desired division of the period of a cycle for $V_{IN}$.

Before leaving FIG. 3 and in preparation for the subject matter of FIG. 4, note that signal 41 is optionally made available as a fundamental ramp to a frequency multiplication circuit, as is signal 48. The (optional) frequency multiplication circuit (59) is the subject of FIG. 4, to which we now turn.

FIG. 4 is a simplified block diagram 59 of a circuit that starts with a fundamental ramp waveform 60 (which may be, but need not necessarily be, 41 from FIG. 3) and creates a stream of narrow pulses that occur at a selected rate as the ramp 60 goes from one of its extreme values to its other. An additional input may be signal 48 from FIG. 3, which is a stream of narrow pulses indicating the 0°/360° conditions for signal 41.

The strategy is to cross selected thresholds of the peak to peak value of the fundamental ramp as it occurs. It will be noted that we have not required that this fundamental ramp input (41, 60) be one that has been conditioned to have a constant peak value. Also, we show that the fundamental ramp as having zero volts as one extreme: this it will be appreciated is merely a convenience. It could actually start from any voltage and much of the same functionality would be available.

Note that the fundamental ramp input (41, 60) is applied to a peak detector 61. Its output is applied to a series string of resistors 62, 63, 64, and 65 that form a voltage divider. In the case where we were intent upon creating a 4× multiplied output (a stream of pulses that are equally spaced apart and occur four to the period of the fundamental ramp) the four resistors 62-65 would all be of equal value. What they do in that case is establish three thresholds 68, 67 and 66 that are each an additional 25% above the other, with threshold 68 being 25% of the peak ramp voltage. In this manner each of the three comparators receives a selected threshold voltage that represents a monotonic sequence of thresholds from lower to higher, and against which the input ramp is compared by the respective comparators. As each next higher threshold is crossed during a cycle of the fundamental ramp, the resulting transition at from minus to plus by that comparator is detected by respective rising edge detectors 74, 73 and 72. Their outputs are analog OR'ed, along with the every 0°/360° signal 48, by OR gate 75 to produce a sequence of narrow pulses 76 that may be amplified by buffer 77 and presented as a (frequency) multiplied output 78.

It will be appreciated that various modifications in the circuit of FIG. 4 are possible. If the fundamental input ramp 60 is does not have zero volts as one extreme, but instead has some other voltage $V_{LOW}$, then it may be desirable if the bottom end of resistor 65 be connected to that voltage, as well, instead of to ground, as is shown. It will be appreciated that circuit 59 compares the instantaneous value of the applied fundamental ramp to selected ratios of the peak value, and uses the previous peak value for that comparison. The ability of the circuit 59 to track changes in peak value and still function correctly (i.e., to not require any particular constant peak amplitude) will depend upon the time constant selected for the peak detector. Also, we have shown a ramp as the input signal. Any monotonically increasing waveform would do as well, although a ramp is nice when a regular division of a period into smaller segments is desired.

If the ramp started at a plus voltage and descended toward ground, then the polarity of the peak detector is reversed, as is the sense of the edge detectors: they become falling edge detectors. Lastly, even when a ramp is used a selected non linear spacing of the output pulses 76 is possible by proper selection of the threshold intervals formed by the resistive divider, and, of course, the number of pulses need not be any particular number, and the presence of signal 48 is not absolutely required. It would be there to provide an output pulse for the rapid falling edge of the applied fundamental sawtooth. (And in this connection, we note that the rapid falling edge of the applied fundamental sawtooth 41,60 does not, in and off itself, contribute a pulse to the output stream 76. The transitions in the comparator outputs would be falling edges for the arrangement shown.)

We claim:

1. A method of generating a sawtooth voltage ramp of period P/2 from an AC work voltage $V_{IN}$ having positive and negative half cycles that are not of the same length of time and whose sum is the period P, the method comprising the steps of:
    (a) converting $V_{IN}$ into a non-symmetrical square wave of period P and whose rising and falling edges correspond to zero crossings of $V_{IN}$;
    (b) detecting first direction edges of the non-symmetrical square wave of step (a) and indicating each detection with a first narrow pulse forming a sequence thereof having P as a period;
    (c) upon each first narrow pulse of step (b), starting from a selected voltage a first ramp voltage waveform whose change in voltage is in a selected direction, is linear with respect to time and continues until the next instance of this step;
    (d) removing any DC components of the first ramp voltage waveform to create a balanced ramp voltage that has equal regions of each polarity about zero volts, and whose opposing peak voltages are generally of equal magnitude;
    (e) detecting zero crossings in the balanced ramp voltage that are in the selected direction and indicating each detection with a second narrow pulse forming a sequence thereof having P as a period and whose occurrences are interleaved and P/2 in time between the sequence of first narrow pulses;
    (f) merging the first and second narrow pulses into one collection of phase symmetric zero crossing pulses of period P/2; and
    (g) upon each narrow pulse in the collection of phase symmetric zero crossing pulses of step (f), starting from another selected voltage a second ramp voltage waveform of period P/2, whose change in voltage is in another selected direction, is linear with respect to time and continues until the next pulse in the collection of phase symmetric zero crossing pulses of step (f).

2. A method as in claim 1 wherein $V_{IN}$ is obtained from a power line voltage and has been perturbed by a series inductance.

3. A method as in claim 1 further comprising the step (h) of utilizing the second ramp voltage waveform to control the operation of a switching power supply.

4. A method as in claim 1 wherein at least one of steps (c) and (g) comprise the steps of charging a capacitor with a constant current source and rapidly discharging the capacitor upon the occurrence of a narrow pulse from a corresponding one of steps (b) or (f), respectively.

5. A method as in claim 1 further comprising the steps (h) of generating the second ramp voltage waveform with a voltage controlled constant current source and (i) of generating a control voltage according to a difference between an amplitude parameter for the second ramp voltage waveform and a reference voltage to (j) regulate the amplitude of the second ramp voltage waveform.

6. A method of generating a series of pulses from a work monotonic voltage waveform $V_{IN}$, the method comprising the steps of:
  (a) applying $V_{IN}$ to a peak detector to produce a peak reference voltage proportional to the peak voltage of $V_{IN}$;
  (b) applying the peak reference voltage of one end of a voltage divider having a plurality of taps;
  (c) coupling at least two of the taps to corresponding inputs of a selected sense for respective comparators;
  (d) coupling $V_{IN}$ to the inputs of a remaining sense for the respective comparators of step (c);
  (e) detecting a transition in a selected direction at the output of each of the respective comparators of step (c) and indicating each detection with a narrow pulse; and
  (f) merging the narrow pulses for each of the respective comparators for step (e) into one collection.

7. A method as in claim 6 wherein $V_{IN}$ is a sawtooth waveform and further comprising the steps (g) of creating a narrow pulse for each abrupt transition separating the cycles of the sawtooth waveform and (h) of including the narrow pulse of step (g) in the merging of step (f).

8. A method as in claim 7 wherein the values of resistors comprising the voltage divider are equal.

* * * * *